United States Patent
Qiu et al.

(10) Patent No.: US 9,325,279 B1
(45) Date of Patent: Apr. 26, 2016

(54) INTEGRATED POWER DEVICE WITH A METAL OXYNITRIDE ACTIVE CHANNEL FOR POWER SWITCHING AND MICROWAVE AMPLIFICATION

(71) Applicants: Cindy X. Qiu, Brossard (CA); Andy Shih, Brossard (CA); Yi-Chi Shih, Los Angeles, CA (US); Lu Han, Brossard (CA); Chunong Qiu, Brossard (CA); Ishiang Shih, Brossard (CA)

(72) Inventors: Cindy X. Qiu, Brossard (CA); Andy Shih, Brossard (CA); Yi-Chi Shih, Los Angeles, CA (US); Lu Han, Brossard (CA); Chunong Qiu, Brossard (CA); Ishiang Shih, Brossard (CA)

( * ) Notice: Subject to any disclaimer, the term of this patent is extended or adjusted under 35 U.S.C. 154(b) by 0 days.

(21) Appl. No.: 14/121,664

(22) Filed: Oct. 6, 2014

(51) Int. Cl.

| | |
|---|---|
| *H01L 29/786* | (2006.01) |
| *H01L 29/76* | (2006.01) |
| *H03F 1/02* | (2006.01) |
| *H01L 29/20* | (2006.01) |
| *H03F 3/213* | (2006.01) |
| *H03F 3/195* | (2006.01) |
| *H03K 3/012* | (2006.01) |

(52) U.S. Cl.
CPC .......... *H03F 1/0205* (2013.01); *H01L 29/2003* (2013.01); *H03F 3/195* (2013.01); *H03F 3/213* (2013.01); *H03K 3/012* (2013.01); *H03F 2200/451* (2013.01)

(58) Field of Classification Search
CPC ...................... H01L 27/1255; H01L 29/42384; H01L 27/1218; H01L 27/1259; H01L 27/124; H01L 21/84; H01L 27/13
USPC ........................................... 438/155; 257/350
See application file for complete search history.

(56) References Cited

U.S. PATENT DOCUMENTS

| | | | | |
|---|---|---|---|---|
| 8,304,778 | B2 * | 11/2012 | Wu .................... | H01L 29/41733 257/57 |
| 2003/0178655 | A1 * | 9/2003 | Winslow ........... | H01L 29/66871 257/280 |
| 2005/0275038 | A1 * | 12/2005 | Shih .................. | H01L 29/78633 257/382 |

* cited by examiner

*Primary Examiner* — Evan Pert
*Assistant Examiner* — Changhyun Yi

(57) ABSTRACT

One object of this invention is to provide a structure of integrated power transistor device having low thermal budget metal oxynitrides as the active channel on a CMOS logic and control circuit chip to form an integrated intelligent power switching module for power switching. The other object of this invention is to provide a structure of integrated power amplifier transistor device having low thermal budget metal oxynitride active channel layer on a CMOS logic and control circuit chip to form an integrated intelligent microwave power amplifier for RF power amplification.

22 Claims, 9 Drawing Sheets

200 Prior Art

INTEGRATED POWER DEVICE WITH A METAL OXYNITRIDE ACTIVE CHANNEL FOR POWER SWITCHING AND MICROWAVE AMPLIFICATION

FIELD OF THE INVENTION

This invention relates to an integrated power transistor and a power transistor circuit with oxynitride active channel on a CMOS or BiCMOS chip for switching of electrical power and amplification of microwaves.

BACKGROUND OF THE INVENTION

Integrated RF Power Amplifier for Wireless Applications

In wireless communication systems, one of the key components is the RF power amplifier for transmitting and the RF low noise amplifier for receiving at microwave frequencies ranging from 500 MHz to 100 GHz. For mobile handsets, the operating frequencies are usually below 5 GHz. These amplifiers must meet strict performance specifications, output power, noise and linearity so that the wireless systems can meet the performance requirements and regulations. To increase the battery operation time of the current technology, both power-added efficiency (PAE) and the operating voltage must be sufficiently high. In addition, the amplifiers should meet the requirements for ruggedness, physical size, reliability and cost. A majority of these amplifiers are used in hand-held phones or mobile phones that have different modulation format. Therefore, the specification requirements for RF amplifiers are different for different applications. For example, there are handheld units for each of the GSM, DCS, CDMA and WCDMA formats or frequency ranges.

To reduce cost and size, it is preferable to adopt integrated radio architecture. A block diagram of an integrated radio architecture (100) is shown in FIG. 1, which includes an RF Front End (110) having main components of T/R switch (112) and a power amplifier (114), an RF IC (120) having LNA (122), receive mixer (RX mixer 124), and RF synthesizer (126) for receive and transmit, and transmit mixer (TX mixer 128), a baseband unit (130) with ADC (132), DAC (134), PLL (136) and baseband processor (138), and an Application Processor (140). The input or output from the RF Front End is received from or connected to an antenna (150). Whereas the Baseband unit includes ADC, DAC and PLL for signals down converted from RF to baseband frequency or for signals to be up converted to RF. The Baseband unit is often implemented again using an advanced Si based CMOS technology.

However, designing and manufacturing wireless transceivers in Si CMOS presents a few challenges. The most difficult one to design and manufacture in CMOS is the power amplifier. Some of the factors affecting power amplifier design in CMOS technology are described below: (1) the low breakdown voltage of deep sub-micron technologies limits the maximum gate-drain voltage and the output power. This is because the output voltage at the transistor's drain normally reaches 2 times the supply voltage for classes B and F, and around 3 times the supply voltage for class E operation. Thus, transistors have to operate at a lower supply voltage, and therefore delivering low power. (2) CMOS technology has lower current drive and $f_{max}$ compared to III-V devices, which means that the gain provided by a single stage is too low and multiple stages are required. (3) Si CMOS normally uses a doped conductive substrate. This results in interaction of RF signals with the substrate and causing leakage in a highly integrated CMOS IC. The leakage from an integrated power amplifier will affect the stability of the IC for example the VCO (voltage controlled oscillator) in a transceiver chain.

It is noted that the Application Processor (140) may include the modules specific to an application including interfacing to a user, data storage-processing and is often implemented using advanced CMOS technology. The Application Processor may be called a logic and control circuit chip. The RF IC (120) includes an LNA (122), a receive mixer (124), a transmit mixer (128) and a RF synthesizer (126). The RF IC may also be implemented by the advanced CMOS technology and operates at GHz or tens of GHz frequency range. For the RF Front End (110) which contains the T/R switch (112) and PA (114), in addition to the requirements for GHz or tens of GHz operation, there is yet an important requirement for high power capability. In order to achieve the high power operation, it is preferable to have transistors which can withstand or handle high voltages for the T/R switch or the PA.

Integrated Modules for Power Switching and Power Management:

Apart from RF power amplifiers for wireless applications, there are applications at low frequencies for intelligent power switching or power management. The range of frequencies is from DC to 100 MHz. In power electronic circuits for power management at such low frequencies, devices capable of handling high voltage, high current and hence high power are required. There are two main categories of devices for power electronics: the discrete power devices and the integrated power circuits (or power integrated circuits). Discrete power devices include power rectifier in a form of PIN, power MOS, IGBT, thyristor, LDMOS and super junction MOS. These discrete devices are mainly based on bulk Si or SOI. Due to the minority carrier storage or accumulation, the switching speed of most bipolar power devices is low, usually below 1 MHz. FIG. 2 shows a schematic block diagram of a intelligent power switch module (200) having a CMOS or BiCMOS logic and control circuit (210), a power supply (220) and a power switch (230). The logic and control circuit (210) receives a command input (212) from an external system and it generates a first control input (214) to control the power switch (230), and a second control input (215) to the power supply to regulate the power (222) fed to the power switch (230). The power switch is connected between an external power source (240) and loads (250) to be fed.

It should be noted that the requirements for the power switch and the logic and control circuit (210) are quite different and many not be integrated easily using CMOS and BiCMOS technology. This is mainly because the power switches and power amplifiers for the power switching or amplification are required to handle high power and hence high voltages. In CMOS technology, the line width of devices has been decreased from micrometer level to tens of nanometers to achieve complex functions and reduced power consumptions. To accommodate the decreased device line width, depth of pn junctions and the thickness of gate oxide to form a MOS FET are also required to reduce. For instance, the junction depth has decreased from 0.5 micrometer for 2 micrometer technology to 20 nm for 45 nm CMOS technology whereas thickness of gate oxide has been cut down form 100 nm to 2 nm. Due to the decrease in the line width, gate oxide thickness and junction depth, the breakdown voltage of transistor devices has decreased and this in turn has limited the operating voltage of the MOSFETs. For the current CMOS technology, the variation of gate oxide thickness and operating voltage with the gate length is almost linear. As the gate length is decreased from 0.6 μm to 0.05 μm and the gate oxide thickness is reduced from 12 nm to 5 nm, the operating voltage decreases from 4.5 volts to about 1 volt. More specifically, for a CMOS technology with a gate length of 0.13 μm, the gate oxide thickness is about 4 nm and the operating voltage is 1.5 volt. Therefore it is evident that the power handling capability of conventional MOSFET is not sufficient for switching of high voltage power or generating high power microwaves or millimeter waves.

It would be ideal if transistors with a high power handling capability can be integrated directly on the CMOS logic and control circuit chip to form switching or amplification circuit for high power and/or high frequency applications. However, as a result of the reduced junction depth and due to the need to maintain the impurity doping profile in order to retain the performance characteristics of the MOSFET, the thermal budget available for processes after the fabrication of CMOS logic and control circuit chip is limited. This limitation on thermal budget is also due to the need to maintain the integrity of the metal lines already formed in the CMOS logic and control circuit chip. For instance, the thermal budget for the post CMOS processes available to form subsequent power switches or power amplifiers on a CMOS chip at 45 nm node should be kept to 700° C.-30 minutes considering shifting of the impurity profile and maintaining of the oxide thickness, and to 500° C.-30 minutes considering integrity of the metal lines. An estimation on the thermal budget limit for post CMOS processes, ie the thermal budget available for processes for the creation of integrated transistors and components to form power switching and amplification on the CMOS logic and control chips, can be obtained from FIG. 3.

The estimation is made based on the consideration of impurity profile shift and impurity activation. The dotted curve D1 shows the variation of anneal time with the anneal temperature required to activate 50% of boron impurity atoms implanted in Si. The first solid curve S1 shows the variation of anneal time versus annealing temperature, for a post CMOS process to form the subsequent power transistors or components for the power switches or power amplifiers. Such anneal would result in a shift or migration of the impurity profile already formed in the junctions following the activation anneal by an amount of 1 nm. The second solid curve S2 shows the variation of anneal time versus anneal temperature, for a post CMOS process to form the subsequent power transistors or components for the power switches or power amplifiers, to result in the shift or migration of the impurity profile already formed in the junctions following the activation anneal, by an amount of 20 nm. These curves were calculated from $\{4D(T)*t\}^{1/2}$. Here D(T) is the diffusion coefficient of B impurity atoms at a given temperature T, and t is the time of the anneal [P. J. Timans, S. P. Tay and Z. Nenyei, Thermal budget reduction drives RTP beyond the 45 nm node, Solid State Technology, February 2005; 45, 2, p. 26.].

For advanced CMOS process technology, the junctions are shallow and the junction depth is in the order of 30 nm. Therefore, take a logic and control circuit chip formed by a CMOS technology having a junction depth of 30 nm as example, a post CMOS process to form the subsequent power transistors or components with a thermal budget described by the solid curve S2 would increase the depth of junctions from the original 30 nm to 50 nm. This will cause a decrease in the distance between the drain implant region and the source implant region. Such decrease would lead to a significant variation in output characteristics of the MOSFET and hence that of the logic and control circuits. To minimize the unwanted change in the output characteristics of the MOSFET and the logic and control circuit due to the post CMOS process to form the power switches for power switching or power transistors for microwave amplification, it is necessary to reduce the thermal budget to that described by the solid curve S1, so that the shift or migration of impurity profile is kept to 1 nm from the original 30 nm junction depth value.

It is thus clear that in the state-of-the-art Si micro-fabrications, the thermal budget of processes after the source-drain implant should be kept as small as possible. From FIG. 3, in order to maintain the B impurity doping profile within 1 nm after the implant and activation anneal, the cumulative thermal budget for the post source-drain implant processes should be kept below 80,000° C.-sec. For another popular impurity P, a trend of profile migration similar to the one shown in FIG. 3 will occur. Hence, the processing time should be kept not substantially larger than 1 second at 1,000° C. Or more preferably, the process time should be 1 second at 900° C. for any post CMOS processes in subsequent creation of transistor and components for power switching and amplification. It would be ideal if integrated intelligent power switching circuit and integrated intelligent RF amplifier can be manufactured directly on advanced CMOS logic and control circuit chip using materials which can be deposited and processed at a low thermal budget.

It would thus be advantageous to develop an integrated power transistor directly on a Si CMOS logic and control circuit chip using a material having high carrier mobility and high breakdown electric field for power switching and microwave amplifications.

SUMMARY OF THE INVENTION

One object of this invention is to provide a structure of integrated power transistor having low thermal budget metal oxynitrides as the active channel on a CMOS logic and control circuit chip to form an integrated intelligent power switching module for power switching. The other object of this invention is to provide a structure of integrated power amplifier transistor having low thermal budget metal oxynitride channel layer on a CMOS logic and control circuit to form an integrated intelligent microwave power amplifier for RF power amplification.

DETAIL DESCRIPTION OF THE PREFERRED EMBODIMENTS

Figure 1:
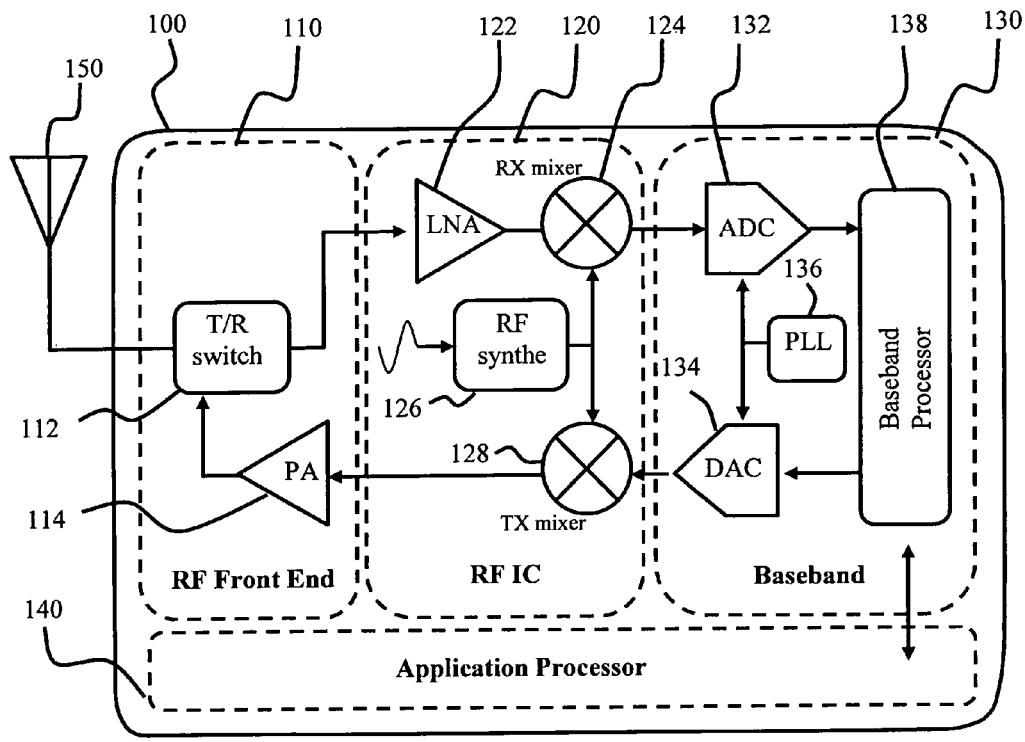
FIG. 1 shows a block diagram of a fully integrated radio-on-chip architecture including the following sub-systems: T/R switch, PA, LNA, mixer, RF synthesizer, ADC, DAC and baseband.
Figure 2:
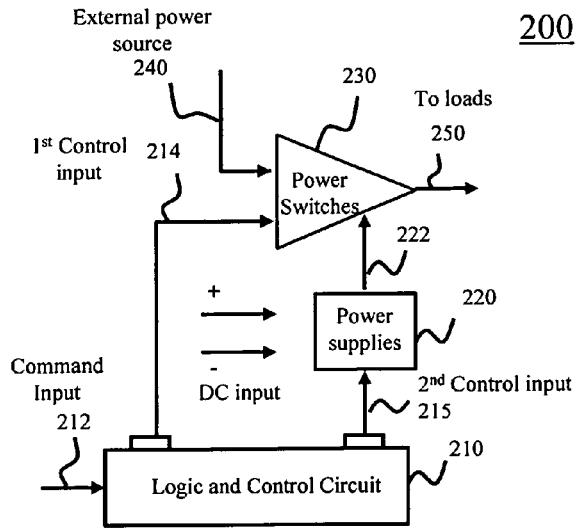
FIG. 2 shows a prior art block diagram of a hybrid intelligent power module connected to an integrated circuit which includes a digital interface logic, power supplies and power switches.

Transistor devices for electric power switching or for microwave amplification are required to operate at high voltages and/or high frequencies. The operation of these transistor devices is often controlled by a logic and control circuit chip. In order to accomplish an integrated and intelligent power switching and microwave amplification functions, it is preferable to integrate the power transistor devices directly with the logic and control circuit chip. The most convenient logic and control circuits are based on CMOS or BiCMOS on monocrystalline Si due to high degree of integration, capability to implement complex functions and storage. However, as the line width and the deletion region width of the junctions associated with the switches and the amplifiers decrease, the voltage handling level also decreases. This is because the breakdown electric field of monocrystalline Si is substantially a constant, about $3 \times 10^5$ V/cm. The depletion region width of junctions decreases with the decrease of dimensions of transistors for the switches and amplifiers which employ progressively shallower junctions. For example, an estimate of breakdown voltage for a junction with a depletion region width of 0.1 µm would be 3 volts. This breakdown voltage is acceptable for transistors for logic operation and low power operation but is too low for transistors for power switching and RF amplification.

Another important parameter is the charge carrier mobility in active semiconductor in transistors for electric switching or amplification. In power switching transistors and RF amplifiers, the charge carrier mobility should be as high as possible in order to achieve operation at microwave or millimeter wave frequencies and to reduce unwanted power losses. For CMOS devices based on Si, the mobility of electrons or holes is dependent on the electric fields and doping density. In many applications, the field effect electron mobility is about 400 cm²/V-sec. When formed into a Si CMOS FET with a gate length less than 100 nm, the cutoff frequency can be larger than 20 GHz. This frequency is sufficient for many switching and microwave amplification applications; however, the breakdown voltage of about 3 volts is too low for power devices for these switching and amplification applications. Take a mobile phone as an example; the power capability for the microwave amplifier is about 1 W. The associated operating voltage to deliver the 1 W power level can be estimated from: $V^2/R=1$ W, where R is the load impedance often equal to 50 ohms so that the voltage is equal to 7 volts, which is much greater than 3 volts. Therefore, the breakdown voltage of transistors in the microwave amplifier circuit should be substantially higher than 7 volts.

Possible semiconductors with comparable or greater mobilities and larger breakdown electric fields than Si are: GaN and SiC. Breakdown electric fields of the two are 3.5 and 2 MV/cm respectively. However, fabrication of GaN or SiC thin films requires processes involving high temperatures (above 1000° C.) and long processing time (several hours). Apparently, the thermal budget of the above fabrication exceeds the value acceptable for a CMOS logic and control circuit chip. Due to the large thermal budget involved in the deposition of the GaN and SiC films, they can not be integrated easily to a Si based logic and control circuits to form an intelligent integrated power switch circuit or an RF amplifier considering the impurity profile shift and performance change.

The breakdown electric field of a material is mainly determined by the energy gap and the mean free path of free carriers. It increases with the increase in the energy gap $E_g$ and decreases with the increase in the free carrier mean free path $L_m$, considering the impact ionization-induced breakdown mechanism. For materials having same free carrier mean free paths $L_m$, the breakdown electric field increases with the increase in energy gap $E_g$, whereas for materials having the same energy gap the breakdown electric field decreases with the increase in the free carrier mean free path. Therefore, the ratio of energy gap to the free carrier mean free path, $E_g/L_m$ would be an important parameter for a material used as an active layer in the construction of a power device of power transistor. Table 1 provides values of $E_g/L_m$ for several metal oxides and metal nitrides related to this invention and some other semiconductors. For Si and Ge the $E_g/L_m$ values are 0.16 and 0.06 and the power capability for transistors involving fine line width would be low. For GaAs the value is 0.25 and fine line width transistors capable of operation at 10 volts can be fabricated to provide moderate microwave power. Although the $E_g/L_m$ values for SiC and GaN are 1.43 and 1.54 and fine line width transistors capable of high power can be fabricated, however, as stated before, the growth of both SiC and GaN often requires very high temperatures (exceeding 1000° C.) so that the thermal budget is too large for them to be integrated on advanced Si CMOS logic and control circuits.

TABLE 1

Values of energy gap, carrier mobility, carrier mean free path, breakdown electric field, MFP and values of $E_g/L_m$ calculated from energy gap and mean free path for various semiconductors and solids.

| Material | $E_g$, eV | µ, cm²/V-s | MFP, L nm | $\xi_{BR}$ | $E_g/L$, eV/nm | References |
|---|---|---|---|---|---|---|
| Si | 1.12 | 1,100 | 6 | $3 \times 10^5$ | 0.16 | [T01] |
| Ge | 0.66 | 2,000 | 10.5 | $1 \times 10^5$ | 0.06 | [T02] |
| Graphene | 1.12 | 10,000 | 775 | $3 \times 10^{5+}$ | 0.0015 | [T03] |
| GaAs | 1.42 | 6,000 | 5.8 | $4 \times 10^5$ | 0.25 | [T02] |
| SiC | 2.86 | 2,000 | 0.7-2.25 | $3 \times 10^6$ | 1.43 | [T04] |
| MoS₂ | 1.29 | 2,000 | 14 | $4 \times 10^{5+}$ | 0.09 | [T05] |
| Al₂O₃ | 9.4 | 25 | 2* | $4 \times 10^7$ | 4.7 | [T06, T07] |
| Ga₂O₃ | 4.9 | 300 | 2* | $7 \times 10^6$ | 2.45 | [T08] |
| ZnO | 3.3 | 200 | 1.8-2.5 | $2 \times 10^6$ | 1.65 | [T09] |
| In₂O₃ | 3.0 | 500 | <4.5 3.7 | $6 \times 10^{6+}$ | >0.8 | [T10, T11] |
| GaN | 3.4 | 2,000 | 2-2.2 | $3 \times 10^6$ | 1.54 | [T12] |
| AlN | 6.2 | 300 | 3 | $4 \times 10^6$ | 2.07 | [T13, T14, T15] |
| InN | 0.65 0.70 | 4,500 | 2.5 | $8 \times 10^{4+}$ | 0.28 | [T16] |
| Zn₃N₂ | 3.22 | 156 | 2* | $7 \times 10^{6+}$ | 1.61 | [T17] |
| BN | 5.96 | 200 | <1 | $7.9 \times 10^6$ | 6 | [T18, T19, T06] |
| TiO₂ | 3.6 | | 2* | | 1.8 | [T21] |
| SnO₂ | 3.7 | 250 | 2* | | 1.85 | [T22, T20] |
| TiN | 2.4 | | 2* | | 1.2 | [T23] |
| SnN | 2.6 | | 2* | | 1.3 | [T24] |

Figure 3:
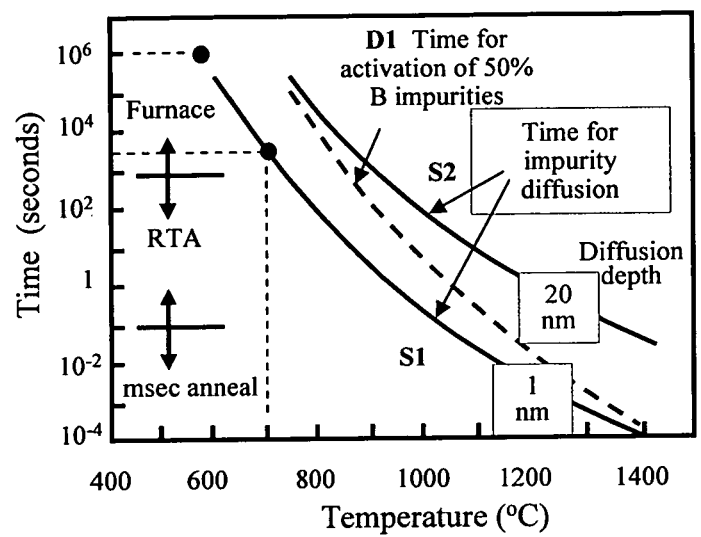
FIG. 3 shows effects of thermal budget on doping impurity profile for boron (B). The second solid curve S2 gives the variation of the maximum thermal anneal time in seconds with anneal temperature for B impurity to retain the impurity profile within 20 nm from the original profile before the anneal. In the state-of-the-art Si micro-fabrication, the thermal budget of processes after the source-drain implant and impurity activation should be kept as small as possible as defined by curve S1.

*Date not available in literatures, estimated values + estimated from FIG. 3b

According to one embodiment of this invention, intelligent integrated power device for electric power switching and microwave amplification is fabricated having metal oxynitrides as the active channel layer. The metal oxynitrides are selected from a materials group including: indium oxynitride, gallium oxynitride, zinc oxynitride, titanium oxynitride, cadmium oxynitride, germanium oxynitride, aluminum oxynitride, tin oxynitride, silicon oxynitride and their mixtures so that the energy gap is substantially larger than 0.5 eV and preferably larger than 1 eV and more preferably larger than 2 eV. The free carrier mean free path for the metal oxynitrides is less than 6 nm and more preferably less than 3 nm. It should be noted that aluminum oxynitride, germanium oxynitride, titanium oxynitride and silicon oxynitride are included to adjust the mean free path of charge carriers or as dopants. Therefore, the amounts to be included should be small, preferably less than 1% and more preferably less than 0.1%. When prepared under appropriate conditions, the charge carrier mobility of metal oxynitrides can be larger compared to pure oxides or nitrides so that the performance of the power switches and the millimeter wave amplifiers can be improved. By having the large energy gap and moderate free carrier mean free path, the breakdown electric field of the metal oxynitrides can be maintained at a high value approaching or exceeding that of GaAs: $4 \times 10^5$ V/cm. The metal oxynitrides are deposited at a low substrate temperature of below 800° C. or more preferably below 600° C. with a thermal budget low enough so that performance characteristics of a Si CMOS logic and control circuit chip integrated on would not be affected substantially. After the low temperature deposition of the metal oxynitrides, an optional rapid thermal annealing at an elevated temperature can be performed for a short duration to enhance the quality and the carrier mobility. Table 1 lists values of energy gap, carrier mobility, carrier mean free path, breakdown electric field, MFP and values of $E_g/L_m$ calculated from energy gap and mean free path for several metal oxides and metal nitrides. When a metal oxynitride is formed by mixing a metal oxide and a metal nitride, $E_g/L_m$ values could be taken as the average value of the two substances.

Figure 4A:
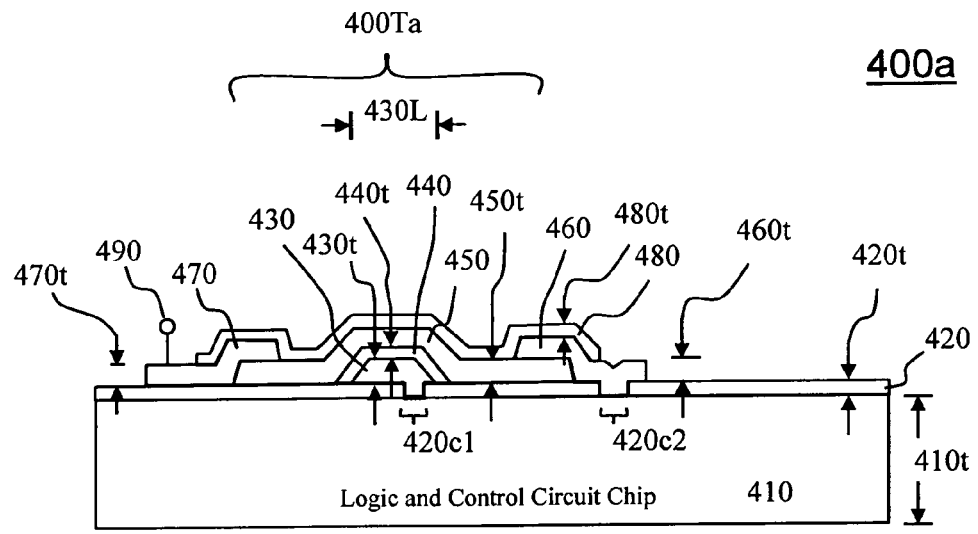
FIG. 4a shows a schematic diagram of an integrated power transistor circuit chip (400a) which comprises a power transistor (400Ta) with a low temperature metal oxynitride first active channel layer (450), fabricated directly on a logic and control circuit chip (410) with a first chip passivation layer (420) to achieve electrical isolation between the power transistor (400Ta) and the logic and control circuit chip (410). The power transistor is connected electrically to the logic and control circuit through via holes (420c1, 420c2).

According to another embodiment of this invention, FIG. 4a depicts a schematic diagram of an integrated power transistor circuit chip (400a) which comprises a power transistor (400Ta) and a logic and control circuit chip (410). The power transistor (400Ta) has a low temperature metal oxynitride first active channel layer (450) with a first active channel layer thickness (450t), fabricated directly on the logic and control circuit chip (410) having a thickness (410t). A first chip passivation layer (420) of a first chip passivation layer thickness (420t) is applied to achieve electrical isolation between the power transistor (400Ta) and the logic and control circuit chip (410). In order to achieve operation state control of the power transistor (400Ta), electrical connection between the power transistor (400Ta) and the logic and control circuit chip (410) is realized through via holes (420c1) and (420c2). A first gate layer (430) having a first gate layer thickness (430t) and a first gate layer length (430L) is disposed to cover via hole (420c1). The first gate layer length (430L) is selected to be in a range of 50 nm to 2 μm so that cross sections of the first gate layer (430) are suitable for effective high frequency switching and amplification for millimeter wave applications. The power transistor (400Ta) has a source (460) having a source thickness (460t) which covers the via hole (420c2), a drain (470) having a drain thickness (470t), a first gate insulating layer (440) having a first gate insulating layer thickness (440t) and a first surface passivation layer (480) with a first surface passivation layer thickness (480t). A power transistor output (470) is connected to external power supply and loads (not shown) through an output contact (490). To form a complete intelligent integrated switching circuit or microwave amplifier, passive components such as resistors, capacitors and inductors are required. These passive components will be fabricated preferably directly on the first chip passivation layer (420). For persons skilled in the art, the fabrication the passive components will be obvious at least for the ones for power switching applications at low frequencies. Therefore, these passive components for the intelligent integrated power circuit for power switching at low frequencies will not be shown.

In order to implement the functions required to control the power transistor (400Ta) for intelligent integrated power switching circuit or RF amplifier having transistors with a low temperature metal oxynitride first active channel layer (450), it is preferable to adopt silicon CMOS chip or a Si BiCMOS chip as the logic and control circuit chip (410) for power switching and microwave amplification. The CMOS or BiC-MOS circuit chip may include processors, sensors and amplifiers for control of the power transistors.

According to the present invention, in order to achieve the high power and hence high voltage operation for the integrated intelligent power electronic circuit chip, materials of the metal oxynitride first active channel layer (450) of the power devices or power transistors are selected from a materials group including: indium oxynitride, gallium oxynitride, zinc oxynitride, titanium oxynitride, cadmium oxynitride, germanium oxynitride, aluminum oxynitride, tin oxynitride, silicon oxynitride and their mixtures so that the energy gap is substantially larger than 0.5 eV, preferably larger than 1 eV and more preferably larger than 2 eV. The free carrier mean free path of the metal oxynitrides is ensured to be less than 6 nm and more preferably less than 3 nm through material selections. It is noted that aluminum oxynitride, germanium oxynitride, titanium oxynitride and silicon oxynitride are included to enhance the stability and adjust the mean free path of the charge carriers or as dopants. Therefore, the amounts to be included should be small, preferably less than 1% and more preferably less than 0.1%. It is noted that when prepared under appropriate conditions, the charge carrier mobility of metal oxynitrides can be larger than pure metal oxides or metal nitrides so that the performance of the power switch circuits and the millimeter wave amplifier can be improved. By having large energy gap and moderate free carrier mean free path, the breakdown electric field of the transistors can be maintained at a high value, approaching or even exceeding that of GaAs: $4 \times 10^5$ V/cm. The selected metal oxynitrides and mixtures are to be deposited at substrate temperatures below 800° C. and more preferably below 500° C. so that a low thermal budget is satisfied and the doping impurity profile associated with junctions and transistors and the metal interconnect lines already formed in the CMOS logic and control circuit chip (410) would not be affected by the deposition of the first active channel layer (450). When the metal oxynitride first active channel layer is deposited at very low temperatures such as less than 200° C., it is preferred to carry out a post deposition anneal. This may be performed at a high temperature as high as 1000° C. for fraction of a second with a small thermal budget.

In order to obtain reliable operation of the integrated intelligent power electronic circuit chip having at least one power device with a low thermal budget metal oxynitride first active channel layer (450) for switching of power from a power source to an external load according to this invention, material of the first gate insulating layer (440) is preferably selected from a group of silicon dioxide, silicon nitride, aluminum oxide, aluminum nitride, hafnium oxide, strontium titanate and their combinations.

Figure 4B:
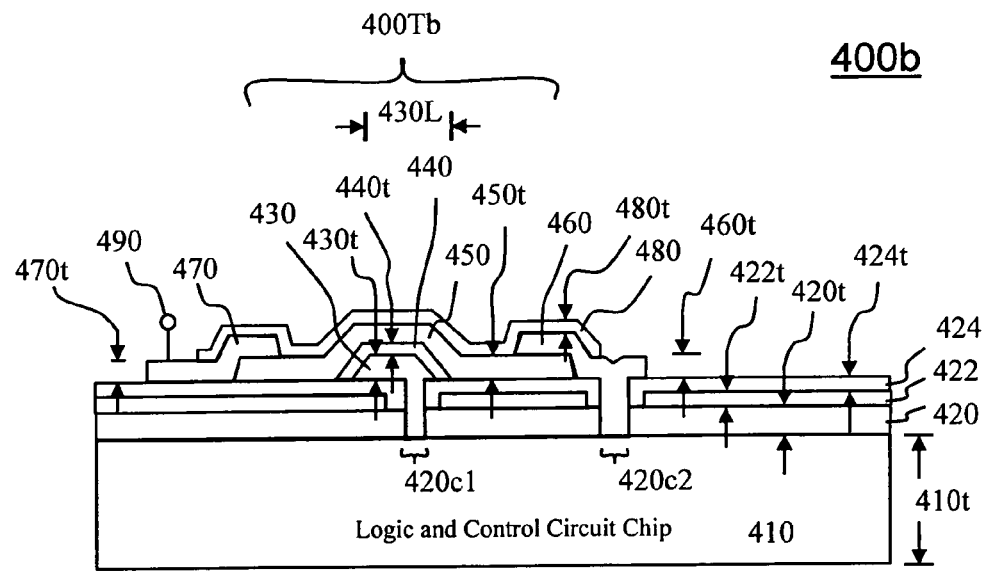
FIG. 4b shows a schematic diagram of an integrated power transistor circuit chip (400b) including a power transistor (400Tb) with a low temperature metal oxynitride first active channel layer (450) fabricated directly on a logic and control circuit chip (410) with a first chip passivation layer (420), a first ground metal layer (422 and a second chip passivation layer (424). The first ground metal layer is sandwiched between the first chip passivation layer and the second chip passivation layer to achieve electrical isolation and to reduce interferences between the power transistor and the logic and control circuit chip.

Switching of electric power or amplification of microwaves by the power transistors may affect the operation of the devices in the logic and control circuit chip (410). According to yet another embodiment of this invention, the unwanted effects of switching of electric power or amplification of microwaves by the power transistor is reduced by incorporating a first ground metal layer. FIG. 4b shows a schematic diagram of an integrated power transistor circuit chip (400b) which comprises a power transistor (400Tb) and a logic and control circuit chip (410) having a thickness (410t), with (400Tb) directly fabricated on (410) with a first chip passivation layer (420) with first chip passivation layer thickness (420t), a first ground metal layer (422) having a first ground metal layer thickness (422t) and a second chip passivation layer (424) having a second chip passivation layer thickness (424t). The first ground metal layer (422) is sandwiched between the first chip passivation layer (420) and the second chip passivation layer (424) to achieve electrical isolation between the power transistor (400Tb) and the logic and control circuit chip (410) and to reduce interferences between the power transistor and the logic and control circuit chip. The power transistor (400Tb) also comprises a first gate layer (430) having a first gate layer thickness (430t) and first gate layer length (430L), a first gate insulating layer (440) having a first gate insulating layer thickness (440t), a low temperature metal oxynitride first active channel layer (450) having a first active channel layer thickness (450t), a source (460) having a source thickness (460t), a drain (470) having a drain thickness (470t) and a first surface passivation layer (480) having a first surface passivation layer thickness (480t). To achieve the operation control of the power transistor (400Tb), the transistor is connected electrically to the logic and control circuit chip (410) through via holes (420c1) and (420c2). The power transistor output (470) is connected to an external power supply and loads (not shown in the figure) through an output contact (490).

Figure 4C:
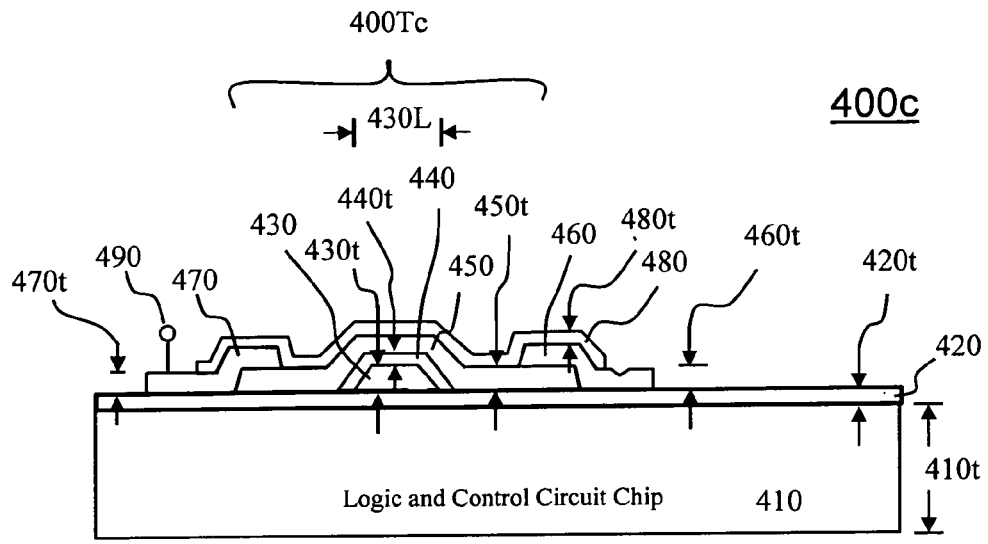
FIG. 4c shows a schematic diagram of an integrated power transistor circuit chip (400c) including a power transistor (400Tc) with a low temperature metal oxynitride first active channel layer (450) fabricated directly on a logic and control circuit chip (410) with a first chip passivation layer (420). The power transistor is disposed on a region of the first chip passivation layer free of via holes and the power transistor is connected electrically to the logic and control circuit chip through via holes outside the region occupied by the power transistor.

The presence of via holes directly under the gate may affect the morphology and hence the performance, at microwaves or millimeter waves. According to one other embodiment of this invention, FIG. 4c gives a schematic diagram of an integrated power transistor circuit chip (400c) which comprises a power transistor (400Tc) and a logic and control circuit chip (410), with (400Tc) directly fabricated on (410). The power transistor consists of a first chip passivation layer (420) having a first chip passivation layer thickness (420t) to achieve electrical isolation between the power transistor (400Tc) and the logic and control circuit chip (410), a first gate layer (430) having a first gate layer thickness (430t) and a first gate layer length (430L), a first gate insulating layer (440) having a, first gate insulating layer thickness (440t), a low temperature metal oxynitride first active channel layer (450) having a first active channel layer thickness (450t), a source (460) with a source thickness (460t), a drain (470) having a drain thickness (470t) and a first surface passivation layer (480) having a first surface passivation layer thickness (480t). The power transistor output (470) is connected to an external power supply and loads (not shown) through an output contact (490). According to this invention, the power transistor (400Tc) is disposed on the first chip passivation layer (420) in a region free of via holes. The electrical connection between the power transistor (400Tc) and the logic and control circuit chip (410) is done through via holes outside the regions occupied by the power transistor (400Tc). Therefore, any unwanted effects of via holes on the gate morphology are eliminated by placing them in areas away from the gates.

Figure 4D:
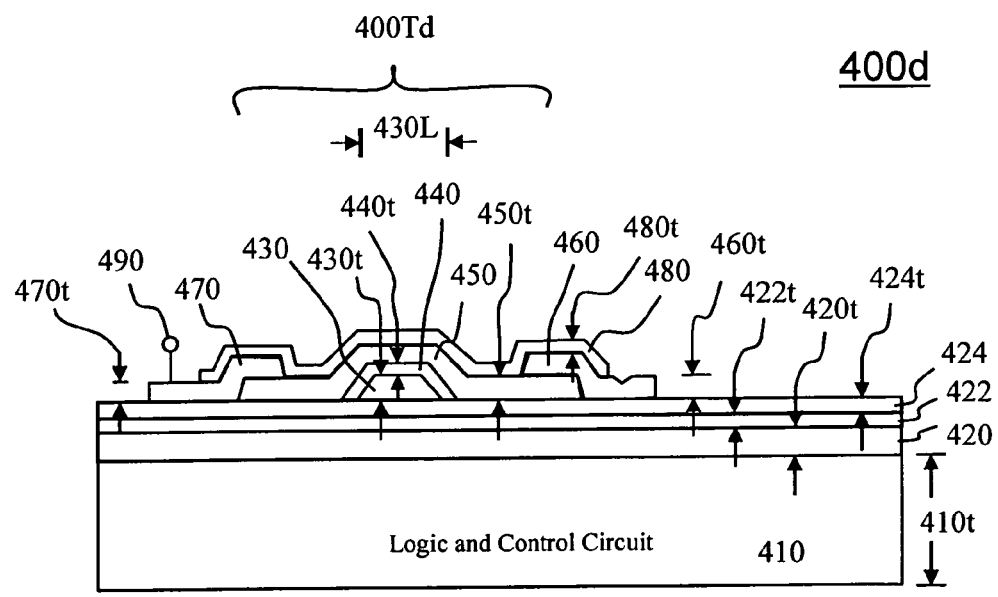
FIG. 4d shows a schematic diagram of an integrated power transistor circuit chip (400d) including a power transistor (400Td) with a low temperature metal oxynitride first active channel layer (450) fabricated directly on a logic and control circuit chip (410) with a first chip passivation layer (420), a first ground metal layer (422) and a second chip passivation layer (424) to achieve electrical isolation and to reduce interferences between the power transistor and the logic and control circuit chip. The power transistor is disposed on a region of the second chip passivation layer free of via holes and it is connected electrically to the logic and control circuit through via holes located outside the region occupied by the power transistor.

For an integrated intelligent power electronic circuit chip for power switching and millimeter wave amplification, it is preferable to have superior electrical isolation the thin film transistors and any components on the first chip passivation layer (420) from the logic and control circuit (410) underneath. This is achieved by introducing a ground metal layer to reduce interferences between the thin film power transistor and the logic and control circuit chip. FIG. 4d shows a schematic diagram of an integrated power transistor circuit chip (400d) having a power transistor (400Td) fabricated directly on a control circuit chip (410) with a first chip passivation layer (420) having a first chip passivation layer thickness (420t), a first ground metal layer (422) having a first ground metal layer thickness (422t), a second chip passivation layer (424) having a second chip passivation layer thickness (424t). The multilayer structure of (420), (422) and (424) is employed to achieve electrical isolation and to reduce interferences between the power transistor (400Td) and the control circuit chip (410). The power transistor (400Td) comprises a first gate layer (430) having a first gate layer thickness (430t) and a first gate layer length (430L), a first gate insulating layer (440) having a first gate insulating layer thickness (440t), a low temperature metal oxynitride first active channel layer (450) having a first active channel layer thickness (450t), a source (460) having a source thickness (460t), a drain (470) having a drain thickness (470t) and a first surface passivation layer (480) having a first surface passivation layer thickness (480t). The power transistor output (470) is connected to an external power supply and loads (not shown) through an output contact (490). The power transistor (400Td) is disposed on the second chip passivation layer (424) in a region devoid of any via holes and (400Td) is electrically connected to the logic and control circuit chip (410) through via holes located outside the region occupied by the power transistor (400Td). By having the via holes in areas outside the gate region, any unwanted interferences between the power transistor and logic and control circuit chip in the integrated power transistor chip with a ground metal layer can be reduced.

Figure 4E:
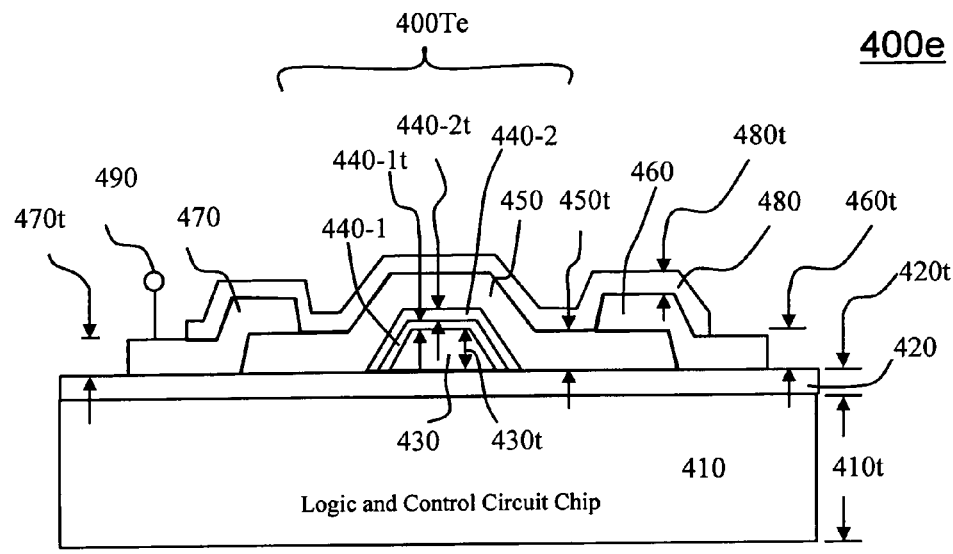
FIG. 4e shows a schematic diagram of an integrated power transistor circuit chip (400e) including a power transistor (400Te) with a low temperature metal oxynitride first active channel layer (450) disposed of directly on a logic and control circuit chip (410) with a first chip passivation layer (420) to achieve electrical isolation between the power transistor and the logic and control circuit chip. A first gate insulating layer (440-1) with a first gate insulating layer fixed charge type and a second gate insulating layer (440-2) with a second gate insulating layer fixed charge type form a composite gate insulating layer to control gate insulating layer charges and threshold voltage the power transistor.

Threshold voltage of a power transistor is affected by fixed charges and charge type in the first gate insulating layer of the power transistor. In order to have better control of the threshold voltage, according to yet another embodiment of this invention, a schematic diagram of an integrated power transistor circuit chip (400e) with a power transistor (400Te) disposed directly on a control circuit chip (410) with a first chip passivation layer (420) having a first chip passivation layer thickness (420t) to achieve electrical isolation between the power transistor (400Te) and the logic and control circuit chip (410) is provided in FIG. 4e. This power transistor (400Te) comprises a first gate layer (430) having a first gate layer thickness (430t), a first gate insulating layer (440-1) having a first gate insulating layer thickness (440-1t) and a first gate insulating layer fixed charge type, a second gate insulating layer (440-2) having a second gate insulating layer thickness (440-2t) and a second gate insulating layer fixed charge type, a low temperature metal oxynitride first active channel layer (450) having a first active channel layer thickness (450t), a source (460) having a source thickness (460t), a drain (470) having a drain thickness (470t) and a first surface passivation layer (480) having a first surface passivation layer thickness (480t). The power transistor output (470) is connected to an external power supply and loads (not shown) through an output contact (490). The first gate insulating layer (440-1) and the second gate insulating layer (440-2) form a composite gate insulating layer for the control of gate insulating layer charges and to further control the threshold voltage of the power transistor (400Te). By controlling the charges and charge type in the first insulating layer (440-1) and the first insulating layer thickness (440-1t), also by controlling the charges and charge type in the second insulating layer (440-2) and the second insulating layer thickness (440-2t), the threshold voltage of the power transistor is controlled.

Figure 4F:
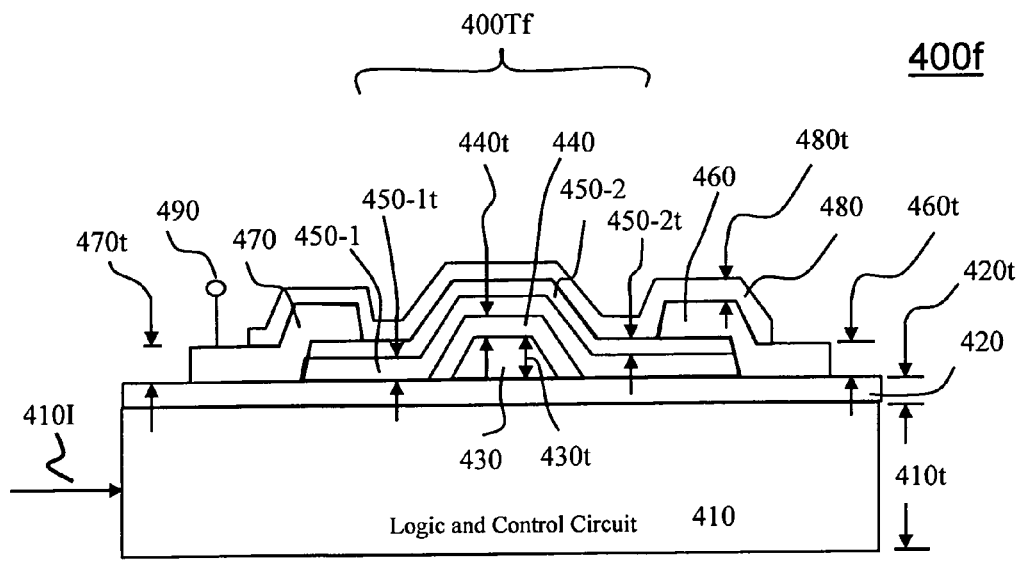
FIG. 4f shows a schematic diagram of an integrated power transistor circuit chip (400f) including a power transistor (400Tf) with a low temperature metal oxynitride first active channel layer (450-1) and a low temperature metal oxynitride second active channel layer (450-2) disposed of directly on a logic and control circuit chip (410) with a first chip passivation layer (420) to achieve electrical isolation between the power transistor and the logic and control circuit chip. Energy gap value of the first active channel layer is substantially greater than that of the second active channel layer to effect free charge carrier and impurity ion separation and to improve mobility of the charge carriers.

To improve mobility of charge carriers, it is preferable that the ions of the doping impurity atoms to be separate from the charge carriers. In this manner, the unwanted impurity carrier scattering can be reduced. According to another embodiment of this invention and as depicted in FIG. 4f, a schematic diagram of an integrated power transistor circuit chip (400f) having a power transistor (400Tf) directly fabricated on a logic and control circuit chip (410) is provided. The logic and control circuit chip (410) is covered with a first chip passivation layer (420) having a first chip passivation layer thickness (420t) to achieve electrical isolation between the power transistor (400Tf) and the logic and control circuit chip (410). The power transistor (400Tf) comprises a low temperature metal oxynitride first active channel layer (450-1) having a first active channel layer thickness (450-1t) and a first active channel layer energy gap, a low temperature metal oxynitride second active channel layer (450-2) having a second active channel layer thickness (450-2t) and a second active channel layer energy gap. Value of the first active channel layer energy gap is selected to be substantially greater than that of the second active channel layer energy gap to effect the free charge carrier and impurity ion separation and to improve mobility of the charge carriers. A first gate layer (430) having a first gate layer thickness (430t), a first gate insulating layer (440) having a first gate oxide layer thickness (440t) are provide for controlling the charge carrier density in the low temperature metal oxynitride second active channel layer (450-2) and increasing charge carriers mobilities. In this manner, the carriers provided by impurities introduced in the low temperature metal oxynitride first active channel layer (450-1) of a larger energy gap will drop into the second active channel layer (450-2) which has a smaller energy gap. Therefore, charge carriers in the second active channel layer (450-2) will have a reduced attraction force from ions in the first active channel layer (450-1). The power transistor (400Tf) also comprises a source (460) having a source thickness (460t), a drain (470) having a drain thickness (470t) and a first surface passivation layer (480) having a first surface passivation layer thickness (480t). The power transistor output (470) is connected to an external power supply and loads (not shown) through an output contact (490).

Figure 4G:
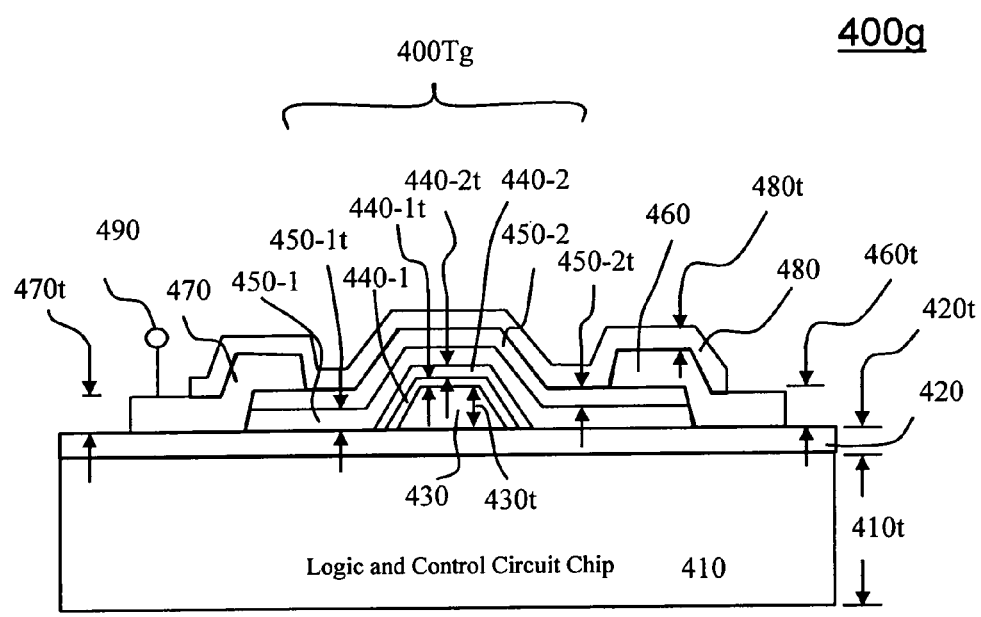
FIG. 4g shows a schematic diagram of an integrated power transistor circuit chip (400g) including a power transistor (400Tg) with a low temperature metal oxynitride first active channel layer (450-1) and a low temperature metal oxynitride second active channel layer (450-2) disposed of directly on a logic and control circuit (410) with a first chip passivation layer (420) to achieve electrical isolation between the power transistor and the logic and control circuit chip. A first gate insulating layer (440-1) and a second gate insulating layer (440-2) form a composite gate oxide layer for controlling of charge carrier density in the second active channel layer and for controlling of gate oxide charges to further control threshold voltage of the power transistor.

To achieve improved charge carrier mobility for the power device and to have a better control of the threshold voltage, according to still another embodiment of this invention and as shown in FIG. 4g, a schematic diagram of an integrated power transistor circuit chip (400g) having a power transistor (400Tg) is provided. This power transistor (400Tg) comprises a low temperature metal oxynitride first active channel layer (450-1) having a first active channel layer thickness (450-1t), a low temperature metal oxynitride second active channel layer (450-2) having a second active channel layer thickness (450-2t). The first and second active channel layers are disposed directly on a logic and control circuit (410) with a first chip passivation layer (420) having a first chip passivation layer thickness (420t) to achieve electrical isolation between the power transistor (400Tg) and the logic and control circuit chip (410). A first gate oxide layer (440-1) having a first gate oxide thickness (440-1t) and a first gate insulating layer fixed charge type, a second gate oxide layer (440-2) having a second gate oxide layer thickness (440-2t) and a second gate insulating layer fixed charge type form a composite gate insulating layer for controlling of the charge carrier density and for increasing charge carrier mobility in the low temperature metal oxynitride second active channel layer (450-2) and also for controlling of the gate oxide charges to achieve controlling of the threshold voltage of the power transistor. The power transistor (400Tg) also comprises a first gate layer (430) having a first gate layer thickness (430t), a source (460) having a source thickness (460t), a drain (470) having a drain thickness (470t) and a first surface passivation layer (480) having a first surface passivation layer thickness (480t). The power transistor output (470) is connected to an external power supply and loads (not shown) through an output contact (490). By adding the second gate insulating layer (440-2) with a second gate insulating layer fixed charge type and a second active channel layer (450-2), the threshold voltage of the power transistor (400g) can be controlled and the charge carrier mobility in the second active channel layer (450-2) can be improved, to effect the improvements of the power transistor for the integrated intelligent power electronic circuit chip.

Figure 5A:
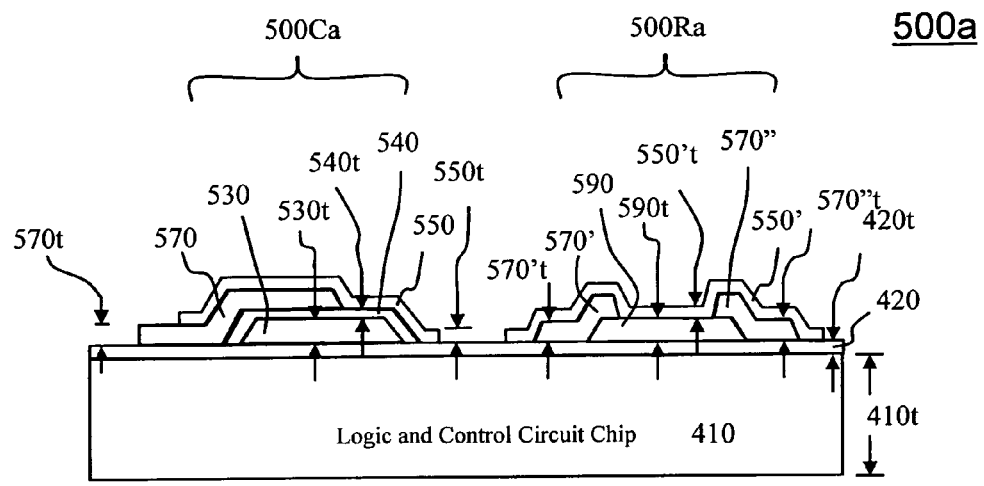
FIG. 5a shows a schematic diagram of an integrated power electronic circuit chip (500a) for integration with a power transistor having a low temperature metal oxynitride active channel layer to form an intelligent power switch or an RF amplifier. The integrated power electronic circuit chip includes a thin film capacitor (500Ca) and a thin film resistor (500Ra) disposed of directly on a logic and control circuit (410) with a first chip passivation layer (420) to achieve electrical isolation between the thin film capacitor and the thin film resistor and the logic and control circuit.
Figure 5B:
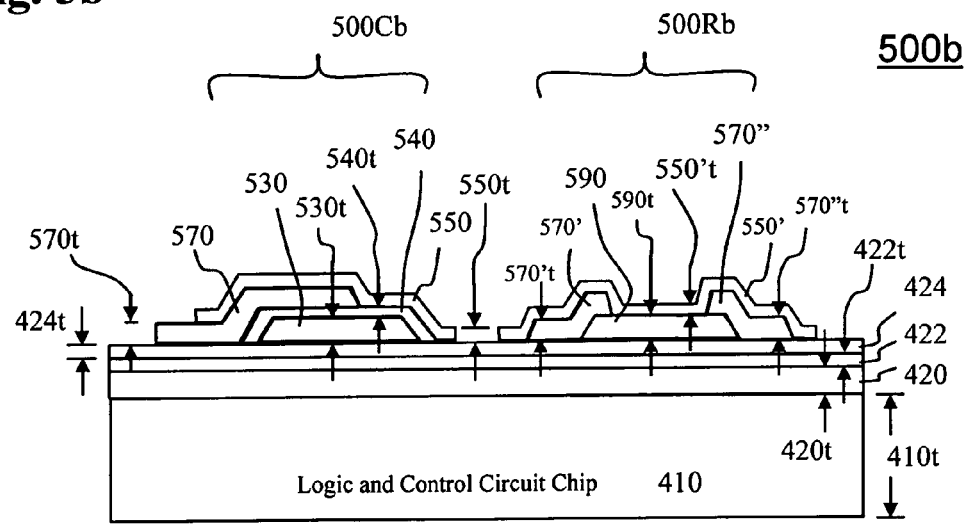
FIG. 5b shows a schematic diagram of an integrated power electronic circuit chip (500b) for integration with a power transistor having a low temperature metal oxynitride active channel layer to form an intelligent power switch or an RF amplifier. (500b) includes a thin film capacitor (500Cb) and a thin film resistor (500Rb) disposed of directly on a logic and control circuit chip (410) with a first chip passivation layer (420), a first ground metal layer (422) and a second chip passivation layer (424) to achieve electrical isolation and to reduce RF interferences between the thin film capacitor, thin film resistor and the logic and control circuit chip.

To achieve signal conditioning for power switching and microwave amplification of an integrated intelligent power electronic circuit chip (500a) in FIG. 5a) having at least one power transistor (not shown) with a low temperature metal oxynitride first active channel layer according to this invention, further comprising a least one thin film resistor (500Ra), at least one thin film capacitor (500Ca) and at least one thin film inductor (not shown) for conditioning of input signals and output signals, as shown in FIGS. 5a and 5b. The thin film capacitor (500Ca) is fabricated on a logic and control circuit chip (410) with a first chip passivation layer (420) having a first chip passivation layer thickness (420t). The thin film capacitor (500Ca) is formed by a first thin film capacitor electrode (530) having a first thin film capacitor electrode thickness (530t), a thin film capacitor dielectric layer (540) having a thin film capacitor dielectric layer thickness (540t), a second thin film capacitor electrode (570) having a second thin film capacitor electrode thickness (570t) and a surface passivation layer (550) having a surface passivation layer thickness (550t). The thin film resistor (500Ra) is also situated on the logic and control circuit chip (410) with the first chip passivation layer (420). The thin film resistor (500Ra) comprises a first thin film resistor electrode (570') having a first thin film resistor electrode thickness (570't), a thin film resistor layer (590) having a thin film resistor layer thickness (590t), a second thin film resistor electrode (570") having a second thin film resistor electrode thickness (570"t) and a surface passivation layer (550) having a surface passivation layer thickness (550t).

For those skilled in the art, it will be obvious for the structure of the inductor. To form a complete power switching circuit and millimeter wave amplifier, a plurality of thin film resistors, thin film capacitors and thin film inductors are required to be integrated with at least one thin film transistor having a low temperature metal oxynitride first active channel layer.

To reduce any unwanted interference between the power transistor and the logic and control circuit chip underneath it, according to still another embodiment of this invention, an integrated intelligent power electronic circuit chip (500b) is provide, as shown in FIG. 5b, to have at least one power transistor (not shown) with a low temperature metal oxynitride first active channel layer for switching of power from a power source to an external load, at least one thin film resistor (500Rb) and at least one thin film capacitor (500Cb) and at least one thin film inductor (not shown) fabricated on the logic and control circuit chip (410). This integrated intelligent power electronic circuit chip (500b) further comprises a first ground metal layer (422) having a first ground metal layer thickness (422t) and a second chip passivation layer (424) having a second chip passivation layer thickness (424t). The first ground metal layer (422) is sandwiched between the first chip passivation layer (420) and the second chip passivation layer (424) to reduce interferences between the integrated intelligent power transistor and logic and control circuit chip (410). A second gate insulating layer having a second gate insulating layer thickness is provided to control threshold of the power transistor and a second active channel layer having a second active channel layer thickness is also provided to improve mobility of carriers in the second active channel layer.

The thin film capacitor (500Cb) comprises a first thin film capacitor electrode (530) having a first thin film capacitor electrode thickness (530t), a thin film capacitor dielectric layer (540) having a thin film capacitor dielectric layer thickness (540t), a second thin film capacitor electrode (570) having a second thin film capacitor electrode thickness (570t) and a surface passivation layer (550) having a surface passivation layer thickness (550t). The thin film resistor (500Rb) comprises a first thin film resistor electrode (570') having a first thin film resistor electrode thickness (570't), a thin film resistor layer (590) having a thin film resistor layer thickness (590t), a second thin film resistor electrode (570") having a second thin film resistor electrode thickness (570"t) and a surface passivation layer (550) having a surface passivation layer thickness (550t).

Figure 6A:
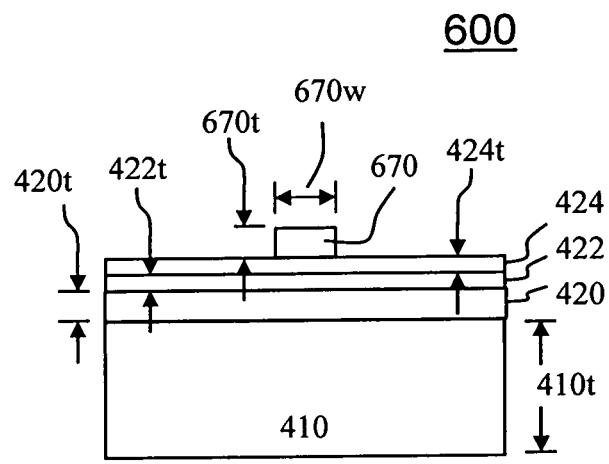
FIG. 6a shows a schematic diagram of an integrated microstrip transmission line (600) for integration with a power transistor of low temperature metal oxynitride active channel layer to form an intelligent power switch or an RF amplifier. (600) comprises a microstrip transmission line (670) disposed of directly on a logic and control circuit chip (410) with a first chip passivation layer (420), a first ground metal layer (422) and a second chip passivation layer (424) to achieve electrical isolation and to reduce RF interferences between the microstrip transmission line (670) and the logic and control circuit (410).
Figure 6B:
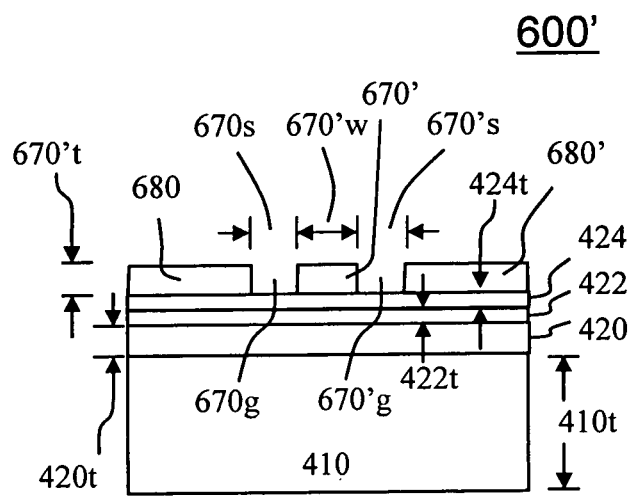
FIG. 6b shows a schematic diagram of an integrated coplanar waveguide (600') for integration with a power transistor of a low temperature metal oxynitride active channel layer to form an intelligent power switch or an RF amplifier. (600') comprised a thin film coplanar waveguide (670'), a first ground line (680) having a first coplanar gap (670g) and a second ground line (680') with a second coplanar gap (670'g) disposed of directly on a logic and control circuit chip (410) with a first surface passivation layer (420), a first ground metal layer (422) and a second passivation layer (424) to achieve electrical isolation between the coplanar waveguide and the logic and control circuit.

Connection between the power transistor, thin film resistor, thin film capacitor and thin film inductor in an intelligent integrated is achieved by a plurality of transmission lines (600) and 600' (shown in FIGS. 6a and 6b) disposed of on the logic and control circuit chip (410) with a first chip passivation layer (424) having a first chip passivation layer thickness (424t), a ground metal layer (422) having a ground metal layer thickness and a second chip passivation layer (420) having a second chip passivation layer thickness (420t). It is noted that the characteristic impedance of the transmission lines (600, 600') must be controlled to be substantially close to 50 ohms in order to reduce unwanted reflection and interference. The control of the characteristic impedance of the micro strip transmission line strip (670) having a micro strip transmission line strip thickness (670t) in FIG. 6a is achieved by adjusting or selecting the micro strip transmission line strip width (670w), second chip passivation layer thickness (420t) and dielectric constant of materials for said first chip passivation layer. Whereas the control of the characteristic impedance of the coplanar transmission line strip (670') having a coplanar transmission line strip thickness (670't) in FIG. 6b is achieved by adjusting or selecting the coplanar transmission line strip width (670'w), gap spacing (670s), (670's) of gaps (670g), (670'g) formed between said coplanar transmission line strip (670') and ground planes (680), (680'), first chip passivation layer thickness (420t) and dielectric constant of materials for said first chip passivation layer. Preferable thickness value of said first chip passivation layer would be in a range from 4 µm to 10 µm and the width of transmission line to a value from 5 µm to 100 µm.

Figure 7:
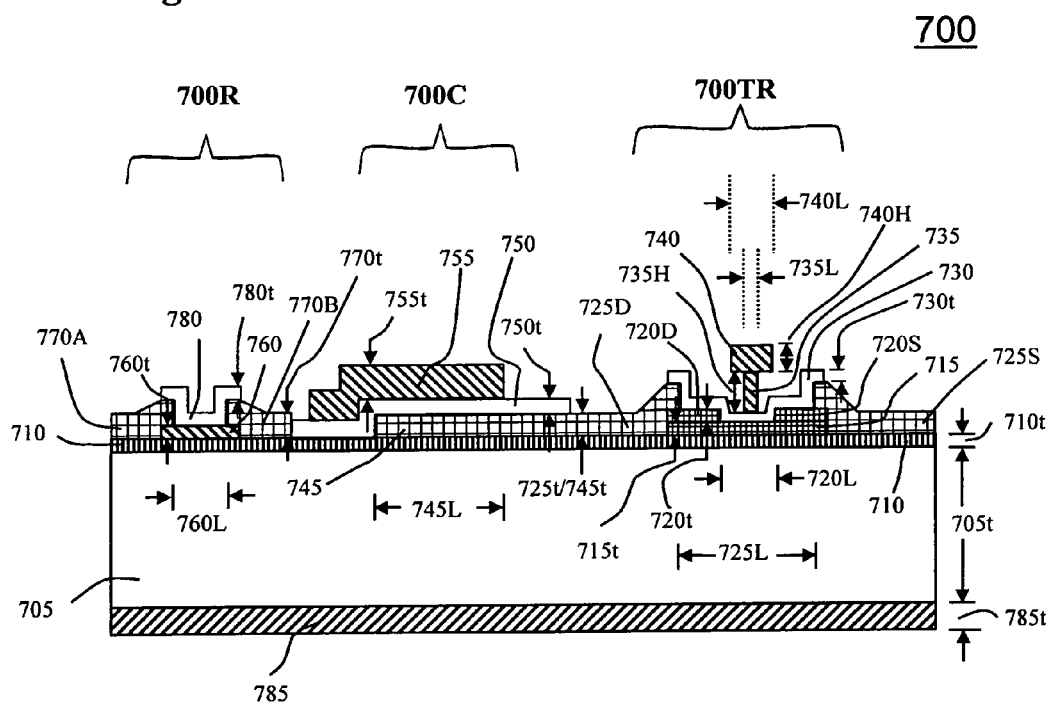
FIG. 7 shows a schematic diagram of a MMIC (700) having a thin film power transistor (700TR) with a low temperature metal oxynitride active channel (715), a thin film capacitor (700C) and a thin film resistor (700R), deposited directly on a Si CMOS logic and control circuit chip (705) for the amplification of millimeter waves.

Although in the above description on the thin film transistors with oxynitride active channel layer for power switching and for millimeter wave amplification, a bottom gate thin film transistor structure has been adopted, thin film transistors with oxynitride active channel layer having a top gate structure may equally be used. Refer now to FIG. 7 where there is shown a thin film resistor (700R), a thin film capacitor (700C) and a thin film transistor (700TR) deposited of a first chip passivation layer (420) having a first chip passivation layer thickness (420t) on a CMOS logic and control circuit chip (410) having a logic and control circuit chip thickness (410t), a bottom metal ground plane (412) having a bottom metal ground plane thickness (412t). Said thin film resistor (700R) having a thin film resistor layer 760 having a thin film resistor thickness (760t), a first thin film resistor electrode (770A), a second thin film resistor electrode 770B having a thin film resistor electrode thickness (770t), defining a thin film resistor electrode spacing (760L), a surface passivation layer (780) having a surface passivation layer thickness 780t. Said thin film capacitor having a thin film capacitor bottom electrode (725) having a thin film capacitor bottom electrode thickness, a thin film capacitor dielectric layer (750) having a thin film capacitor dielectric layer thickness (750t), a thin film capacitor top electrode (755) having a thin film capacitor top electrode thickness (755t), overlapping said thin film capacitor bottom electrode by capacitor overlapping area (745L). Said thin film transistor (700TR) having an oxynitride active channel layer (715) having a active channel thickness (715t), a drain contact layer (720D), a source contact layer (720S) having a contact layer thickness (720t), said drain contact layer contacting a portion of said thin film capacitor bottom electrode (725), whereas said source contact layer (720S) contacting a portion of source metal electrode (725S), a gate insulating layer (730) having a gate insulating layer thickness (730T), a gate stem portion (735) having a gate stem portion length (735L), a gate stem portion height (735H), a gate head portion (740) having a gate head portion length (740L) and a gate head portion height (740H), form a portion of a integrated intelligent power switching module and a millimeter wave amplifier having said thin film transistor with a top gate configuration. Said gate stem portion length and gate stem portion height are selected in a range from 50 nm to 2 µm so that cross sections of said gate step portion and gate head portion are suitable for effective high frequency switching and amplification for millimeter wave applications.

To simplify the description, a thin film inductor which is required to form the module and amplifier is not shown in FIG. 7. It is noted that to form the complete module or amplifier, at least one thin film resistors, at least one thin film capacitors, at least one thin film inductors and at least one thin film transistors with the oxynitride active channels will be required. In order to minimize the unwanted interferences between said CMOS logic and control circuit chip and the thin film resistors, thin film capacitors, thin film inductors and thin film transistors deposited on top of said first chip passivation layer (420), it is preferable to adopt a first ground metal layer (422) and a second chip passivation layer (424) (see FIG. 4d) so that said first ground metal layer is sandwiched between said first chip passivation layer and second chip passivation layer. Thickness of said first chip passivation layer is selected so that impedance of transmission formed on top of said first chip passivation layer is substantially close to 50 ohms.

REFERENCES

References for Table 1

[T01] Journal of Applied Physics, vol 101, pp. 114511-1-6, 2007. "Quasiballistic transport in nanometer Si metal-oxide-semiconductor field-effect transistors: Experimental and Monte Carlo analysis", J. Lusakowski et al.

[T02] Physics of Semiconductor Devices, S. M. Sze, Wiley Interscience, 1981.

[T03] Applied Physics Letters, vol 92, pp. 151911-1-3, 2008. "Extremely high thermal conductivity of grapheme: Prospects for thermal management applications in nanoelectronic circuits", S. Ghosh et al.

[T04] Journal of Nuclear Materials, vo. 307-311, p. 1120, 2002. "Thermal diffusity/conductivity or irradiated monolithic CVD-SiC", G. E. Youngblood et al.

[T05] Physical Review B, vol. 85, p. 115317, 2012, "First-principles study of the phonon-limited mobility in n-type single-layer $MoS_2$", Kristen Kansbjerg et al.

[T06] Proc. 25th International Conference on Microelectronics, Belgrade, Serbia and Montenegro, 14-17 May, 2006, "Relationship between Intrinsic Breakdown Field and Bandgap of Materials", Li-Mo Wang.

[T07] Journal of American Ceramic Society, vol. 75, No. 10, pp. 2790-2794, 1992. "Effect of Crystal Orientation on Conductivity and Electron Mobility in Single-Crystal Alumina", Fritz G. Willt et al.

[T08] Applied Physics Letters, vol. 104, pp. 203111-1-5 (2014). "High-Voltage Field Effect Transistors with Wide-Bandgap β-Ga$_2$O$_3$ Nanomembranes", Wan Sik Hwang et al.

[T09] World Journal of Condensed Matter Physics, vol. 2, pp. 42-46, 2012. "Dynamic Deformation Electron-Phonon Interaction in Disordered Bulk Semiconductor", Pushpendra Tripathi et al.

[T10] Journal of Semiconductors, vol. 33, No. 4, pp. 043001-1-4, April 2012. "Structural and optical properties of Zn$_3$N$_2$ films prepared by magnetron sputtering in NH$_3$—Ar mixture gases", Wu Jiangyan et al.

[T11] Journal of Physics D: Applied Physics, vol. 45 (2012) 135101-1-9. "Zinc nitride films prepared by reactive RF magnetron sputtering of zinc in nitrogen containing atmosphere", Nanke Jiang et al.

[T12] Applied Physics Letters, vol. 78, No. 8 19 pp. 1080-1082 February, 2001. "Initial stages of molecular-beam epitaxy growth of GaN on 6H-SiC", J. Lu et al.

[T13] Ultramicroscopy, vol. 99, pp. 49-64, 2004. "Simulation of electron energy loss near-edge structure at the Al and N K edges and Al L23 edge in cubic aluminum nitride", J. C. Le Bossé et al.

[T14] Surface & Coatings Technology, vol. 196, pp. 130-134, 2005. "Electrical properties of AlN thin films prepared by ion beam enhanced deposition", Zhenghua An et al.

[T15] Fujikura Technical Review, pp. 41-45, 2009. "Single Crystal Growth of Aluminum Nitride", H. Kamata et al.

[T16] Chin. Phys. B Vol. 21, No. 9, pp. 093402-1-7, 2012. "Electron inelastic mean free paths in solids: A theoretical approach", Siddharth H. Pandya et al.

[T17] Thesis for the Master of Science Degree, Técnico Lisboa, 2013. "Deposition of Zn$_3$N$_2$ thin films and application in TFT structures", Maria Luísa Lobo Moutinho Soares de Melo.

[T18] Journal of Vacuum Science and Technology A, vol. 24 No. 3, pp. 396-407, 2006. "Electron inelastic mean free path and dielectric properties of a-boron, a-carbon, and their nitrides as determined by quantitative analysis of reflection electron energy loss spectroscopy", P. Prieto et al.

[T19] Physical Review B, vol. 85, pp. 035415-1-9, 2012. "Band gap engineering by functionalization of BN sheet", A. Bhattacharya et al.

[T20] Journal of Science and Technology, vol. 4, No. 1, pp. 61-71, 2012. "Study on Optical Properties of Tin Oxide Thin Film at Different Annealing Temperature", Saturi Baco et al.

[T21] Revista Mexicana De F'isica x55 (1) pp. 102-104, 2009. "Optical and structural characterization of TiOxNy films deposited by reactive magnetron sputtering", E. Hern'andez-Rodr'iguez et al.

[T22] Applied Physics A, vol. 109, pp. 267-271, 2012. "p-type conduction in nitrogen-doped SnO2 films grown by thermal processing of tin nitride films", S. S. Pan et al.

[T23] Journal of Physical Chemistry C, vol. 112, pp. 13248-257, 2008. "Effect of Prolonged Oxidation on Semiconducting Properties of Titanium Dioxide", T. Bak et al.

[T24] Nanoscale Research Letters, vol. 4, pp. 1103-1109, 2009. "Synthesis of Tin Nitride SnxNy Nanowires by Chemical Vapour Deposition", Matthew Zervos et al.

What is claimed is:

1. An integrated intelligent power electronic circuit chip having at least one power transistor with a low temperature metal oxynitride first active channel layer for switching of power from a power source to an external load, comprising a logic and control circuit chip, a first chip passivation layer having a first chip passivation layer thickness, a first gate layer having a first gate layer thickness, a first gate insulating layer having a first gate insulating layer thickness and a first gate insulating layer fixed charge type, a first active channel layer having a first active channel layer thickness and a first active channel layer energy gap, a drain, a source and a first surface passivation layer having a first surface passivation layer thickness, said power transistor is electrically connected to said logic and control circuit chip through via holes and receives control signal from said logic and control circuit chip.

2. An integrated intelligent power electronic circuit chip having at least one power transistor with a low temperature metal oxynitride first active channel layer for switching of power from a power source to an external load as defined in claim 1, wherein said logic and control circuit chip is a silicon CMOS chip.

3. An integrated intelligent power electronic circuit chip having at least one power transistor with a low temperature metal oxynitride first active channel layer for switching of power from a power source to an external load as defined in claim 1, wherein material of said low temperature metal oxynitride first active channel layer is selected from a group comprising: indium oxynitride, gallium oxynitride, zinc oxynitride, cadmium oxynitride, germanium oxynitride, tin oxynitride, titanium oxynitride, aluminum oxynitride, silicon oxynitride and their mixtures.

4. An integrated intelligent power electronic circuit chip having at least one power transistor with a low temperature metal oxynitride first active channel layer for switching of power from a power source to an external load as defined in claim 1, wherein materials of said first gate insulating layer is selected from a group including silicon dioxide, silicon nitride, aluminum oxide, aluminum nitride, hafnium oxide, strontium titanate, and their combinations.

5. An integrated intelligent power electronic circuit chip having at least one power transistor with a low temperature metal oxynitride first active channel layer for switching of power from a power source to an external load as defined in claim 1, further comprising a first ground metal layer having a first ground metal layer thickness and a second chip passivation layer having a second chip passivation layer thickness, said first ground metal layer being sandwiched between said first chip passivation layer and second chip passivation layer to reduce interferences between said power transistor device and logic and control circuit chip, wherein said second chip passivation layer is selected to facilitate the formation of a microwave transmission line on said second chip passivation layer to achieve a characteristic impedance substantially close to 50 ohms.

6. An integrated intelligent power electronic circuit chip having at least one power transistor with a low temperature metal oxynitride first active channel layer for switching of power from a power source to an external load as defined in claim 1, further comprising a second active channel layer having a second active channel layer thickness and a second active channel layer energy gap, said second active channel layer energy gap is selected to be substantially smaller than said first active channel layer energy gap to improve mobility of charge carriers in said second active channel layer, wherein material of said metal oxynitride second active channel layer is selected from a material group comprising: indium oxynitride, gallium oxynitride, zinc oxynitride, cadmium oxynitride, germanium oxynitride, tin oxynitride, titanium oxynitride, aluminum oxynitride, silicon oxynitride and their mixtures.

7. An integrated intelligent power electronic circuit chip having at least one power transistor with a low temperature metal oxynitride first active channel layer for switching of power from a power source to an external load as defined in claim 1, further comprising a second gate insulating layer having a second gate insulating layer thickness and a second gate insulating layer fixed charge type to control threshold voltage of said power transistor.

8. An integrated intelligent power electronic circuit chip having at least one power transistor with a low temperature metal oxynitride first active channel layer for switching of power from a power source to an external load as defined in claim 1, further comprising a second gate insulating layer having a second gate insulating layer thickness and a second gate insulating layer fixed charge type to control threshold of said power transistor, and a second active channel layer having a second active channel layer thickness and a second active channel layer energy gap to improve mobility of carriers in said second active channel layer, said second active channel layer energy gap is selected to be substantially smaller than said first active channel layer energy gap to improve mobility of charge carriers in said second active channel layer, material of said metal oxynitride second active channel layer is selected from a material group comprising: indium oxynitride, gallium oxynitride, zinc oxynitride, cadmium oxynitride, germanium oxynitride, tin oxynitride, titanium oxynitride, aluminum oxynitride, silicon oxynitride and their mixtures.

9. An integrated intelligent power electronic circuit chip having at least one power transistor with a low temperature metal oxynitride first active channel layer for switching of power from a power source to an external load as defined in claim 1, further comprising a first ground metal layer having a first ground metal layer thickness and a second chip passivation layer having a second chip passivation layer thickness, said first ground metal layer being sandwiched between said first chip passivation layer and second chip passivation layer to reduce interferences between said power transistor and logic and control circuit chip, a second gate insulating layer having a second gate insulating layer thickness and a second gate insulating layer fixed charge type to control threshold of said power transistor, and a second active channel layer having a second active channel layer thickness and a second active channel layer energy gap, said second active channel layer energy gap is selected to be substantially smaller than said first active channel layer energy gap to improve mobility of charge carriers in said second active channel layer, material of said second active channel layer is selected from a metal oxynitride material group comprising: indium oxynitride, gallium oxynitride, zinc oxynitride, cadmium oxynitride, germanium oxynitride, tin oxynitride, titanium oxynitride, aluminum oxynitride, silicon oxynitride and their mixtures, wherein said second chip passivation layer is selected to facilitate the formation of a microwave transmission line on said second chip passivation layer to achieve a characteristic impedance substantially close to 50 ohms.

10. An integrated intelligent power electronic circuit chip having at least one power transistor with a low temperature metal oxynitride first active channel layer for switching of power from a power source to an external load as defined in claim 1, further comprising a least one thin film resistor, at least one thin film capacitor and at least one thin film inductor for conditioning of input signals and output signals, said thin film resistor, thin film capacitor and thin film inductor are disposed of on said first chip passivation layer, connection between said power transistor, thin film resistor, thin film capacitor and thin film inductor is achieved by a plurality of transmission lines disposed of on said first chip passivation layer, to achieve conditioning of said microwaves and millimeter waves, said first chip passivation layer is selected to facilitate the formation of a microwave transmission line on said first chip passivation layer to achieve a characteristic impedance substantially close to 50 ohms.

11. An integrated intelligent power electronic circuit chip having at least one power transistor with a low temperature metal oxynitride first active channel layer for switching of power from a power source to an external load as defined in claim 1, wherein said power transistor having a top gate configuration with a gate stem portion having a gate stem portion length and gate stem portion height, a gate head portion having a gate head portion length and gate head portion height, cross sections of said gate stem portion and gate head portion are selected to effect high frequency switching and amplification for millimeter wave applications.

12. An integrated intelligent power amplifier circuit chip having at least one power transistor with a low temperature metal oxynitride first active channel layer for amplification of microwave and millimeter waves, comprising a logic and control circuit chip, a first chip passivation layer having a first chip passivation layer thickness, a first gate layer having a first gate layer thickness, a first gate insulating layer having a first gate insulating layer thickness and a first gate insulating layer fixed charge type, a first active channel layer having a first active channel layer thickness and a first active channel layer energy gap, a drain, a source and a first surface passivation layer having a surface passivation layer thickness, said power transistor is electrically connected to said logic and control circuit chip through via holes and receives control signal from said logic and control circuit chip.

13. An integrated intelligent power amplifier circuit chip having at least one power transistor with a low temperature metal oxynitride first active channel layer for amplification of microwave and millimeter waves as defined in claim 12, wherein said logic and control circuit chip is a silicon CMOS chip.

14. An integrated intelligent power amplifier circuit chip having at least one power transistor with a low temperature metal oxynitride first active channel layer for amplification of microwave and millimeter waves as defined in claim 12, wherein material of said metal oxynitride first active channel layer is selected from a group comprising: indium oxynitride, gallium oxynitride, zinc oxynitride, tin oxynitride, cadmium oxynitride, germanium oxynitride, aluminum oxynitride, titanium oxynitride, silicon oxynitride and their mixtures.

15. An integrated intelligent power amplifier circuit chip having at least one power transistor with a low temperature metal oxynitride first active channel layer for amplification of microwave and millimeter waves as defined in claim 12, wherein material of said first gate insulating layer is selected from a group including silicon dioxide, silicon nitride, aluminum oxide, aluminum nitride, hafnium oxide, strontium titanate, and their combinations.

16. An integrated intelligent power amplifier circuit chip having at least one power transistor with a low temperature metal oxynitride first active channel layer for amplification of microwave and millimeter waves as defined in claim 12, further comprising a first ground metal layer having a first ground metal layer thickness and a second chip passivation layer having a second chip passivation layer thickness, said first ground metal layer being sandwiched between said first chip passivation layer and second chip passivation to reduce interferences between said power transistor and logic and control circuit chip, wherein said second chip passivation layer is selected to facilitate the formation of a microwave transmission line on said second chip passivation layer to achieve a characteristic impedance substantially close to 50 ohms.

17. An integrated intelligent power amplifier circuit chip having at least one power transistor with a low temperature metal oxynitride first active channel layer for amplification of microwave and millimeter waves as defined in claim 12, further comprising a second active channel layer having a second active channel layer thickness and a second active channel layer energy gap, said second active channel layer energy gap is selected to be substantially smaller than said first active channel layer energy gap to improve mobility of charge carriers in said second active channel layer, wherein material of said second active channel layer is selected from a group comprising: indium oxynitride, gallium oxynitride, zinc oxynitride, tin oxynitride, cadmium oxynitride, germanium oxynitride, aluminum oxynitride, titanium oxynitride, silicon oxynitride and their mixtures.

18. An integrated intelligent power amplifier circuit chip having at least one power transistor with a low temperature metal oxynitride first active channel layer for amplification of microwave and millimeter waves as defined in claim 12, further comprising a second gate insulating layer having a second gate insulating layer thickness and a second gate insulating layer fixed charge type to control threshold voltage of said power transistor.

19. An integrated intelligent power amplifier circuit chip having at least one power transistor with a low temperature metal oxynitride first active channel layer for amplification of microwave and millimeter waves as defined in claim 12, further comprising a second gate insulating layer having a second gate insulating layer thickness and a second gate insulating layer fixed charge type to control threshold of said power transistor, and a second active channel layer having a second active channel layer thickness and a second active channel layer energy gap, said second active channel layer energy gap is selected to be substantially smaller than said first active channel layer energy gap to improve mobility of charge carriers in said second active channel layer, material of said second active channel layer is selected from a material group comprising: indium oxynitride, gallium oxynitride, zinc oxynitride, cadmium oxynitride, germanium oxynitride, tin oxynitride, titanium oxynitride, aluminum oxynitride, silicon oxynitride and their mixtures.

20. An integrated intelligent power amplifier circuit chip having at least one power transistor with a low temperature metal oxynitride first active channel layer for amplification of microwave and millimeter waves as defined in claim 12, further comprising a first ground metal layer having a first ground metal layer thickness and a second chip passivation layer having a second chip passivation layer thickness, said first ground metal layer being sandwiched between said first chip passivation layer and second chip passivation to reduce interferences between said power transistor and logic and control circuit chip, a second gate insulating layer having a second gate insulating layer thickness and a second gate insulating layer fixed charge type to control threshold of said power transistor, and a second active channel layer having a second active channel layer thickness and a second active channel layer energy gap to improve mobility of charge carriers in said second active channel layer, wherein material of said second active channel layer is selected from a material group comprising: indium oxynitride, gallium oxynitride, zinc oxynitride, cadmium oxynitride, germanium oxynitride, tin oxynitride, titanium oxynitride, aluminum oxynitride, silicon oxynitride and their mixtures, wherein said second chip passivation layer is selected to facilitate the formation of a microwave transmission line on said first chip passivation layer to achieve a characteristic impedance substantially close to 50 ohms.

21. An integrated intelligent power amplifier circuit chip having at least one power transistor with a low temperature metal oxynitride first active channel layer for amplification of microwave and millimeter waves as defined in claim 12, further comprising a least one thin film resistor, at least one thin film capacitor and at least one thin film inductor, said thin film resistor, thin film capacitor and thin film inductor are disposed of on said first chip passivation layer, connection between said power transistor, thin film resistor, thin film capacitor and thin film inductor is achieved by a plurality of transmission lines disposed of on said first chip passivation layer for conditioning of said microwaves and millimeter waves, said first chip passivation layer is selected to facilitate the formation of a microwave transmission line on said first chip passivation layer to achieve a characteristic impedance substantially close to 50 ohms.

22. An integrated intelligent power amplifier circuit chip having at least one power transistor with a low temperature metal oxynitride first active channel layer for amplification of microwave and millimeter waves as defined in claim 12, wherein said power transistor having a top gate configuration with a gate stem portion having a gate stem portion length and gate stem portion height, a gate head portion having a gate head portion length and gate head portion height, cross sections of said gate stem portion and gate head portion are selected to effect high frequency switching and amplification for millimeter wave applications.

* * * * *